United States Patent
Mukai

(10) Patent No.: US 10,656,519 B2
(45) Date of Patent: May 19, 2020

(54) RESIST STRIPPER AND RESIST STRIPPING METHOD

(71) Applicant: Nagase ChemteX Corporation, Osaka-shi, Osaka (JP)

(72) Inventor: Yoshihiro Mukai, Hyogo (JP)

(73) Assignee: Nagase ChemteX Corporation, Osaka (JP)

( * ) Notice: Subject to any disclaimer, the term of this patent is extended or adjusted under 35 U.S.C. 154(b) by 0 days.

(21) Appl. No.: 15/818,211

(22) Filed: Nov. 20, 2017

(65) Prior Publication Data

US 2018/0143531 A1 May 24, 2018

(30) Foreign Application Priority Data

Nov. 22, 2016 (JP) .................. 2016-226997
Jun. 6, 2017 (JP) .................. 2017-111724

(51) Int. Cl.
| | | |
|---|---|---|
| *G03F 7/42* | (2006.01) | |
| *G03F 7/00* | (2006.01) | |
| *H01L 21/311* | (2006.01) | |
| *C11D 7/50* | (2006.01) | |
| *H01L 21/4763* | (2006.01) | |

(52) U.S. Cl.
CPC .......... *G03F 7/0035* (2013.01); *C11D 7/5004* (2013.01); *G03F 7/425* (2013.01); *G03F 7/426* (2013.01); *H01L 21/31111* (2013.01); *H01L 21/47635* (2013.01)

(58) Field of Classification Search
CPC .......... G03F 7/426; G03F 7/425; G03F 7/422; G03F 7/42; C11D 7/5004
See application file for complete search history.

(56) References Cited

U.S. PATENT DOCUMENTS 6,024,895 A * 2/2000 Shimizu ................ C08G 61/02
252/500
2003/0004075 A1 1/2003 Suto et al.

FOREIGN PATENT DOCUMENTS

| | | |
|---|---|---|
| CN | 1394357 | 1/2003 |
| CN | 105339816 | 2/2016 |
| CN | 105358649 | 2/2016 |
| JP | 2001-249465 | 9/2001 |
| JP | 2003-316029 | 11/2003 |
| JP | 2009-224782 | 10/2009 |
| JP | 2012-032757 | 2/2012 |

* cited by examiner

*Primary Examiner* — Daborah Chacko-Davis
(74) *Attorney, Agent, or Firm* — Hamre, Schumann, Mueller & Larson, P.C.

(57) ABSTRACT

An object of the present invention is to provide a resist stripper for stripping resist from a substrate with a metallic line and/or a metal oxide film, which has excellent stripping properties and shows reduced reattachment of stripped resist, and which is also excellent in antifoaming properties. The resist stripper contains: (A) an amine; (B) an organic solvent; and (C) 5.0 wt % or less of a sulfonic or carboxylic acid having a weight average molecular weight of 5,000 to 1,000,000 or a salt thereof, and the resist stripper is free of (D) water, or contains (D) 60 wt % or less of water.

8 Claims, No Drawings

RESIST STRIPPER AND RESIST STRIPPING METHOD

TECHNICAL FIELD

The present invention relates to a resist stripper and a method for stripping resist.

BACKGROUND ART

Semiconductor substrates and the like have an electrode structure provided with fine wiring lines. In the process for producing such a product, resist is used. A known electrode structure for thin-film transistors (TFTs) is formed by combining an oxide semiconductor film (e.g. IGZO) with a metallic line (e.g. copper). This electrode structure is formed, for example, by applying resist to a metallic line (e.g. copper) and an oxide semiconductor film (e.g. IGZO) formed on a substrate, subjecting them to exposure and development processes to pattern the resist, etching the conductive metallic layer, the oxide semiconductor film, and other surfaces using the patterned resist as a mask, and then removing the resist no longer required with a resist stripper.

Patent Literature 1, for example, proposes a semi-aqueous stripping and cleaning composition which contains predetermined amounts of an aminobenzenesulfonic acid, a water miscible organic solvent, and water. However, the composition disclosed in Patent Literature 1, when used to strip resist on substrates with metallic lines and/or metal oxide films, can unfortunately allow the once-stripped resist to reattach to the substrates with metallic lines and/or metal oxide films.

CITATION LIST

Patent Literature

Patent Literature 1: JP 2009-224782 A

SUMMARY OF INVENTION

Technical Problem

The present invention aims to provide a resist stripper for stripping resist from a substrate with a metallic line and/or a metal oxide film, which has excellent stripping properties and shows reduced reattachment of stripped resist, and which is also excellent in antifoaming properties.

Solution to Problem

The inventor made intensive studies and found that a resist stripper containing an amine and an organic solvent, which contains as a reattachment prevention agent a sulfonic or carboxylic acid having a certain weight average molecular weight or a salt thereof in an amount equal to or less than a predetermined value and which is free of water or adjusted to have an amount of water equal to or less than a predetermined value, has excellent stripping properties and shows reduced reattachment of stripped resist, and is also excellent in antifoaming properties. This finding has led to the completion of the present invention.

Specifically, the resist stripper of the present invention contains:
(A) an amine;
(B) an organic solvent; and
(C) 5.0 wt % or less of a sulfonic or carboxylic acid having a weight average molecular weight of 5,000 to 1,000,000 or a salt thereof,
the resist stripper being free of (D) water, or containing (D) 60 wt % or less of water.

Preferably, the component (C) in the resist stripper of the present invention is a polyanilinesulfonic acid, polystyrenesulfonic acid, or polyacrylic acid, or a salt of any of these acids.

Preferably, the resist stripper of the present invention contains 0.0025 to 5.0 wt % of the component (C).

Preferably, the resist stripper of the present invention contains 1 to 40 wt % of an alkanolamine as the component (A).

Preferably, the resist stripper of the present invention further contains (D) water, and the component (B) and the component (D) are present in a ratio by weight of (B):(D) of 0.2:1 to 70:1.

Preferably, the resist stripper of the present invention is used to strip resist from a substrate with copper and/or IGZO.

The method for stripping resist according to the present invention is a method for stripping resist from a substrate with a metallic line and/or a metal oxide film, the method including using the resist stripper of the present invention.

Preferably, in the method for stripping resist according to the present invention, the metallic line is formed of copper and the metal oxide film is formed of IGZO.

Advantageous Effects of Invention

The resist stripper of the present invention has excellent stripping properties and shows reduced reattachment of stripped resist, and is also excellent in antifoaming properties because it contains as a reattachment prevention agent a sulfonic or carboxylic acid having a certain weight average molecular weight or a salt thereof in an amount equal to or less than a predetermined value, and it is free of water or adjusted to have an amount of water equal to or less than a predetermined value.

DESCRIPTION OF EMBODIMENTS

<<Resist Stripper>>

The resist stripper of the present invention contains:
(A) an amine;
(B) an organic solvent; and
(C) 5.0 wt % or less of a sulfonic or carboxylic acid having a weight average molecular weight of 5,000 to 1,000,000 or a salt thereof, and
the resist stripper is free of (D) water, or contains (D) 60 wt % or less of water. The resist stripper is preferably used to strip resist from a substrate with copper and/or IGZO.

<(A) Amine>

Examples of the amine (A) (hereinafter, also referred to simply as component (A)) include, without limitation, N-methylethanolamine, monoethanolamine, monomethyldiethanolamine, triethanolamine, monomethylamine, monoethylamine, propylamine, butylamine, 2-ethylhexylamine, 2-ethylhexyloxypropylamine, 2-ethoxypropylamine, dimethylamine, diethylamine, dipropylamine, dibutylamine, trimethylamine, triethylamine, tripropylamine, tributylamine, 3-diethylaminopropylamine, di-2-ethylhexylamine, dibutylaminopropylamine, tetramethylethylenediamine, tri-n-octylamine, t-butylamine, sec-butylamine, methylaminopropylamine, dimethylaminopropylamine, methyliminobispropylamine, 3-methoxypropylamine, allylamine, diallylamine, triallylamine, isopropylamine, diisopropylamine, iminopropylamine, iminobispropylamine, ethylenediamine, diethylenetriamine, triethylenetetramine, tetraethylenepentamine, pentaethylenehexamine, N,N-dimethylethanolamine, N,N-diethylethanolamine, aminoethylethanolamine, N-methyl-N,N-diethanolamine, N,N-dibutylethanolamine, N-methylethanolamine, 3-amino-1-propanol, and N,N-bis(2-hydroxyethyl)cyclohexylamine. In view of resist stripping properties, alkanolamines are preferred among these, with N-methylethanolamine (MMA), monoethanolamine (MEA), monomethyldiethanolamine (MDA), and triethanolamine (TEA) being more preferred. These materials as component (A) may be used alone or in combination of two or more.

The amount of component (A) is preferably, but not limited to, 1 to 40 wt %, more preferably 5 to 25 wt % of the resist stripper of the present invention. When the amount of component (A) is less than 1 wt %, resist stripping properties may deteriorate, while when it is more than 40 wt %, viscosity may increase, leading to problems with workability.

<(B) Organic Solvent>

Examples of the organic solvent (B) (hereinafter, also referred to simply as component (B)) include, without limitation, acetone, monoalcohols (e.g. methanol, ethanol), glycols (e.g. ethylene glycol, diethylene glycol, diethylene glycol monomethyl ether, diethylene glycol monoethyl ether, diethylene glycol monobutyl ether, diethylene glycol dimethyl ether, propylene glycol, propylene glycol methyl ether, dipropylene glycol), pyrrolidones (e.g. N-methyl-2-pyrrolidone), amides (e.g. N,N-dimethylacetoamide, N,N-dimethylformamide), nitriles (e.g. acetonitrile), sulfoxides (e.g. dimethylsulfoxide), sulfones (e.g. sulfolane), and ethylene carbonate. In view of resist stripping properties, the organic solvent (B) is preferably at least one selected from the group consisting of glycols, sulfoxides, and amides, among the above examples, and more preferably from diethylene glycol monomethyl ether, diethylene glycol monoethyl ether, and diethylene glycol monobutyl ether. These materials as component (B) may be used alone or in combination of two or more.

In view of resist stripping properties and other properties, the amount of component (B) is preferably, but not limited to, 10 to 95 wt %, more preferably 15 to 90 wt %, still more preferably 25 to 80 wt %, of the resist stripper of the present invention.

<(C) Sulfonic or Carboxylic Acid Having Weight Average Molecular Weight of 5,000 to 1,000,000 or Salt Thereof>

The resist stripper of the present invention contains, as a reattachment prevention agent, (C) a sulfonic or carboxylic acid having a weight average molecular weight of 5,000 to 1,000,000 or a salt thereof (hereinafter, also referred to simply as component (C)) to show excellent stripping properties and reduced reattachment of stripped resist.

Examples of the sulfonic acid used as component (C) include, without limitation, polyanilinesulfonic acid, polystyrenesulfonic acid, styrene/styrenesulfonic acid copolymers, poly{2-(meth)acryloylamino-2,2-dimethylethanesulfonic acid}, 2-(meth)acryloylamino-2,2-dimethylethanesulfonic acid/styrene copolymers, 2-(meth)acryloylamino-2,2-dimethylethanesulfonic acid/acrylamide copolymers, 2-(meth)acryloylamino-2,2-dimethylethanesulfonic acid/(meth)acrylic acid copolymers, 2-(meth)acryloylamino-2,2-dimethylethanesulfonic acid/(meth)acrylic acid/acrylamide copolymers, 2-(meth)acryloylamino-2,2-dimethylethanesulfonic acid/styrene/acrylamide copolymers, 2-(meth)acryloylamino-2,2-dimethylethanesulfonic acid/styrene/(meth)acrylic acid copolymers, naphthalenesulfonic acid-formaldehyde condensates, methylnaphthalenesulfonic acid-formaldehyde condensates, dimethylnaphthalenesulfonic acid-formaldehyde condensates, anthracenesulfonic acid-formaldehyde condensates, melaminesulfonic acid-formaldehyde condensates, and anilinesulfonic acid-phenol-formaldehyde condensates. Examples of the carboxylic acid include, without limitation, aliphatic or aromatic carboxylic acid polymers such as polyacrylic acid, polymaleic acid, and acrylic acid/maleic acid copolymers. These sulfonic and carboxylic acids may form a copolymer such as an acrylic acid/sulfonic acid copolymer. The cation that forms a salt with any of these sulfonic and carboxylic acids may be, for example, but not limited to, an alkali metal, alkaline earth metal, or organic amine. Among the examples indicated above, polyanilinesulfonic acid, polystyrenesulfonic acid, and polyacrylic acid, and salts of these acids are preferred in order to reduce reattachment to copper, IGZO, or other materials, while polyanilinesulfonic acid is preferred for reduced foaming and other reasons. These materials as component (C) may be used alone or in combination of two or more.

The component (C) may have any weight average molecular weight in the range of 5,000 to 1,000,000, preferably 10,000 to 75,000. If the weight average molecular weight of component (C) is less than 5,000, the amount of reattached resist may increase.

The component (C) may be present in any amount that is equal to or less than 5.0 wt % of the resist stripper of the present invention, and preferably in the range of 0.0025 to 5.0 wt %, more preferably 0.025 to 1.0 wt %. When the amount of component (C) is less than 0.0025 wt %, a low resist reattachment prevention effect may be provided, while when it is more than 5.0 wt %, resist stripping properties may deteriorate.

The resist stripper of the present invention may contain any other components in addition to the above components (A) to (C). Examples of the other components include, without limitation: (D) water; anticorrosives; pH adjusters; and antifoaming agents. These components may be used alone or in combination of two or more.

<(D) Water>

The resist stripper of the present invention may not contain (D) water (hereinafter, also referred to simply as component (D)), but preferably further contains the component (D) in view of liquid life and other properties.

In the case where the resist stripper of the present invention contains the component (D), the component (D) may be present in any amount that is equal to or less than 60 wt % of the resist stripper, and preferably in an amount of 40 wt % or less, more preferably 30 wt % or less. If the amount of component (D) is more than 60 wt %, stripping properties may deteriorate. When the component (D) is present, the lower limit of the amount of component (D) is not particularly critical, and may be, for example, 0.5 wt % or 1 wt %.

When the resist stripper of the present invention contains the component (D), the ratio by weight of component (B) to component (D) ((B):(D)) is preferably, but not limited to, 0.2:1 to 70:1. When the ratio by weight of (B) to (D) is less than 0.2:1, resist stripping properties may deteriorate, while when it is more than 70:1, liquid life may decrease.

<Anticorrosive>

In the case where the resist stripper of the present invention contains an anticorrosive, the anticorrosive may be present in any amount, and preferably in the range of 0.01 to 1.0 wt % in view of resist stripping properties and other properties.

The resist stripper of the present invention can be prepared by mixing the components (A) to (C) and optional other components by an ordinary method.

<<Method for Stripping Resist>>

The method for stripping resist according to the present invention is a method for stripping resist from a substrate with a metallic line and/or a metal oxide film, which includes using the resist stripper of the present invention. Any method may be used to strip resist from a substrate with a metallic line and/or a metal oxide film using the resist stripper of the present invention. For example, it may include immersing the substrate with a metallic line and/or a metal oxide film in the resist stripper of the present invention, or may include ultrasonication, showering, spraying, brushing, immersion and shaking, single wafer processing, or other processes. The resist stripper of the present invention can be used to strip both positive and negative photoresists.

The metallic line may be formed of any material, such as copper, aluminum, titanium, molybdenum, chromium, or tungsten. Among these, copper is preferred in view of conductivity.

The metal oxide film may be formed of any material, such as indium gallium zinc oxide (IGZO), indium gallium oxide (IGO), indium tin oxide (ITO), indium zinc oxide (IZO), gallium zinc oxide (GZO), zinc tin oxide (ZTO), zinc oxide (ZnO), or zinc aluminum oxide (ZAO). Among these, IGZO is preferred in order to prevent resist reattachment.

In the case where the resist stripper of the present invention is used to produce a TFT having a metal oxide film (e.g. IGZO) and a metallic line (e.g. copper), the resist stripper is preferably one that shows reduced resist reattachment to both the metal oxide film and the metallic line. In this case, stripping of resist may be performed multiple times. When it is desired to perform multiple times, specifically, resist is stripped from a substrate with a metal oxide film (metallic line), and then a metallic line (metal oxide film) is formed through another resist mask, followed by stripping the resist from the substrate with the metal oxide film and the metallic line. During this process, the resist stripper of the present invention may be used in all the resist stripping steps, or in either of the stripping steps.

EXAMPLES

The present invention is described with reference to examples below. The examples, however, are not intended to limit the scope of the present invention. Hereinafter, the terms "part(s)" and "%" refer to "part(s) by weight" and "wt %", respectively, unless otherwise specified.

1. Materials Used

In the examples and comparative examples below, the following materials were used.

1-1. Component (A)
  N-methylethanolamine (MMA)
  Monoethanolamine (MEA)
  Monomethyldiethanolamine (MDA)
  Triethanolamine (TEA)

1-2. Component (B)
  Diethylene glycol monobutyl ether (BDG)
  Diethylene glycol monomethyl ether (MDG)
  Diethylene glycol monoethyl ether (EDG)

1-3. Component (C)
  Polyanilinesulfonic acid (weight average molecular weight: 10,000)
  Melaminesulfonate-formaldehyde condensate (weight average molecular weight: 30,000)
  Polyacrylic acid (weight average molecular weight: 10,000)
  MEA salt of naphthalenesulfonic acid-formaldehyde condensate (weight average molecular weight: 5,600)
  Polystyrenesulfonic acid (weight average molecular weight: 75,000)
  Polystyrenesulfonic acid (weight average molecular weight: 1,000,000)

1-4. Additives Other than Component (C)
  Anilinesulfonic acid (weight average molecular weight: 173)
  Polyoxyethylene tridecyl ether (weight average molecular weight: 420)
  Ethylenediaminetetrapolyoxyethylenepolyoxypropylene (weight average molecular weight: 3,500)
  Alkyl (C16-C18) trimethylammonium chloride (weight average molecular weight: 348)
  Alkylbenzenesulfonic acid and salt thereof (weight average molecular weight: 322)
  Sodium lauryl sulfate (weight average molecular weight: 288)

1-5. Component (D)
  Pure water

2. Examples and Comparative Examples

Examples 1 to 14, Comparative Examples 1 to 11

The components (A) to (D) were mixed to the ratio by weight indicated in Table 1 or Table 2 to prepare a resist stripper. The reattachment amount, stripping properties, and antifoaming properties of the resist strippers prepared as above were evaluated as described below. Tables 1 and 2 show the results. The reattachment amount to IGZO was not evaluated in Examples 6, 8, 10, 11, 13, and 14, and Comparative Examples 9 to 11. The stripping properties were not evaluated in Examples 2, 4, 5, 7, 9, 10, and 12, and Comparative Examples 1 and 2. The antifoaming properties were not evaluated in Examples 13 and 14, and Comparative Examples 7 to 11. The resist stripper of Example 1 had high viscosity and thus low workability.

TABLE 1

| | | Example | | | | | | |
|---|---|---|---|---|---|---|---|---|
| Example No. | | 1 | 2 | 3 | 4 | 5 | 6 | 7 |
| Component (A) | MMA | 50 | — | 10 | — | 10 | — | — |
| | MEA | — | 20 | — | 20 | — | — | — |
| | MDA | — | — | — | — | — | 25 | — |
| | TEA | — | — | — | — | — | — | 40 |
| Component (B) | BDG | 9.775 | 59.5 | 58.5 | 55 | 68.523 | 44.5 | — |
| | MDG | — | — | — | — | — | — | 29.55 |
| | EDG | — | — | — | — | — | — | — |

TABLE 1-continued

|  |  | | | | | | | |
|---|---|---|---|---|---|---|---|---|
| Component (C) | Polyanilinesulfonic acid | — | — | 1.5 | — | 0.025 | — | — |
|  | Melamine sulfonate-formaldehyde condensate | — | — | — | — | — | — | — |
|  | Polyacrylic acid | 0.225 | — | — | — | — | — | 0.225 |
|  | MEA salt of naphthalenesulfonic acid-formaldehyde condensate | — | 0.25 | — | 5 | — | — | — |
|  | Polystyrenesulfonic acid (Mw: 75,000) | — | — | — | — | — | — | — |
|  | Polystyrenesulfonic acid (Mw: 1,000,000) | — | — | — | — | — | 0.033 | — |
| Other additives | Anilinesulfonic acid | — | — | — | — | — | — | — |
|  | Polyoxyethylene tridecyl ether | — | — | — | — | — | — | — |
|  | Ethylenediaminetetrapolyoxyethylene-polyoxypropylene | — | — | — | — | — | — | — |
|  | Alkyl (C16-C18) trimethylammonium chloride | — | — | — | — | — | — | — |
|  | Alkylbenzenesulfonic acid and salt thereof | — | — | — | — | — | — | — |
|  | Sodium lauryl sulfate | — | — | — | — | — | — | — |
| Component (D) | Pure water | 40 | 20.25 | 30 | 20 | 21.475 | 30.467 | 30.225 |
| Reattachment amount | Cu | Excellent | Good | Excellent | Good | Excellent | Excellent | Excellent |
|  | IGZO | Excellent | Excellent | Excellent | Good | Excellent | — | Excellent |
|  | Stripping properties | Excellent | — | Excellent | — | — | Excellent | — |
|  | Antifoaming properties | Excellent | Good | Good | Fair | Excellent | Fair | Fair |

|  |  | Example | | | | | | |
|---|---|---|---|---|---|---|---|---|
| Example No. |  | 8 | 9 | 10 | 11 | 12 | 13 | 14 |
| Component (A) | MMA | 10 | — | 10 | 10 | 1 | — | — |
|  | MEA | — | — | — | — | — | — | — |
|  | MDA | — | — | — | — | — | 5 | 5 |
|  | TEA | — | 10 | — | — | — | — | — |
| Component (B) | BDG | 68.5 | — | 88.5 | 88.45 | 77.5 | — | — |
|  | MDG | — | — | — | — | — | — | — |
|  | EDG | — | 59.5 | — | — | — | 68.5 | 65 |
| Component (C) | Polyanilinesulfonic acid | — | 0.025 | — | — | 0.0025 | — | — |
|  | Melamine sulfonate-formaldehyde condensate | 0.5 | — | — | — | — | — | — |
|  | Polyacrylic acid | — | — | 0.225 | — | — | — | — |
|  | MEA salt of naphthalenesulfonic acid-formaldehyde condensate | — | — | — | — | — | 1.5 | 5 |
|  | Polystyrenesulfonic acid (Mw: 75,000) | — | — | — | 0.09 | — | — | — |
|  | Polystyrenesulfonic acid (Mw: 1,000,000) | — | — | — | — | — | — | — |
| Other additives | Anilinesulfonic acid | — | — | — | — | — | — | — |
|  | Polyoxyethylene tridecyl ether | — | — | — | — | — | — | — |
|  | Ethylenediaminetetrapolyoxyethylene-polyoxypropylene | — | — | — | — | — | — | — |
|  | Alkyl (C16-C18) trimethylammonium chloride | — | — | — | — | — | — | — |
|  | Alkylbenzenesulfonic acid and salt thereof | — | — | — | — | — | — | — |
|  | Sodium lauryl sulfate | — | — | — | — | — | — | — |
| Component (D) | Pure water | 21 | 30.475 | 1.275 | 1.46 | 21.475 | 25 | 25 |
| Reattachment amount | Cu | Good | Good | Excellent | Good | Excellent | Good | Good |
|  | IGZO | — | Good | — | Excellent | Excellent | — | — |
|  | Stripping properties | Excellent | — | — | Excellent | — | Excellent | Good |
|  | Antifoaming properties | Excellent | Good | Excellent | Fair | Excellent | — | — |

TABLE 2

|  |  | Comparative Example | | | | | | | | | | |
|---|---|---|---|---|---|---|---|---|---|---|---|---|
| Comparative Example No. |  | 1 | 2 | 3 | 4 | 5 | 6 | 7 | 8 | 9 | 10 | 11 |
| Component (A) | MMA | 10 | 10 | 10 | 10 | 10 | 10 | 10 | 10 | — | — | — |
|  | MEA | — | — | — | — | — | — | — | — | — | — | — |
|  | MDA | — | — | — | — | — | — | — | — | 5 | 5 | 5 |
|  | TEA | — | — | — | — | — | — | — | — | — | — | — |
| Component (B) | BDG | 69 | — | 68.5 | 68.5 | 68.5 | 68.5 | 68.5 | 68.5 | — | — | — |
|  | MDG | — | 69 | — | — | — | — | — | — | — | — | — |
|  | EDG | — | — | — | — | — | — | — | — | 70 | 10 | 60 |
| Component (C) | Polyanilinesulfonic acid | — | — | — | — | — | — | — | — | — | — | — |
|  | Melamine sulfonate-formaldehyde condensate | — | — | — | — | — | — | — | — | — | — | — |
|  | Polyacrylic acid | — | — | — | — | — | — | — | — | — | — | — |
|  | MEA salt of naphthalenesulfonic acid-formaldehyde condensate | — | — | — | — | — | — | — | — | — | 5 | 10 |

TABLE 2-continued

| | Comparative Example No. | 1 | 2 | 3 | 4 | 5 | 6 | 7 | 8 | 9 | 10 | 11 |
|---|---|---|---|---|---|---|---|---|---|---|---|---|
| Other additives | Polystyrenesulfonic acid (Mw: 75,000) | — | — | — | — | — | — | — | — | — | — | — |
| | Polystyrenesulfonic acid (Mw: 1,000,000) | — | — | — | — | — | — | — | — | — | — | — |
| | Anilinesulfonic acid | — | — | 0.5 | — | — | — | — | — | — | — | — |
| | Polyoxyethylene tridecyl ether | — | — | — | 0.5 | — | — | — | — | — | — | — |
| | Ethylenediaminetetra-polyoxyethylene-polyoxypropylene | — | — | — | — | 0.5 | — | — | — | — | — | — |
| | Alkyl (C16-C18) trimethylammonium chloride | — | — | — | — | — | 0.14 | — | — | — | — | — |
| | Alkylbenzenesulfonic acid and salt thereof | — | — | — | — | — | — | 0.5 | — | — | — | — |
| | Sodium lauryl sulfate | — | — | — | — | — | — | — | — | 0.12 | — | — |
| Component (D) | Pure water | 21 | 21 | 21 | 21 | 21 | 21.36 | 21 | 21.38 | 25 | 80 | 25 |
| Reattachment amount | Cu | Poor | Poor | Poor | Poor | Poor | Fair | Poor | Fair | Fair | Good | Good |
| | IGZO | Poor | Poor | Poor | Fair | Poor | Poor | Poor | Poor | — | — | — |
| Stripping properties | | — | — | Excellent | Excellent | Excellent | Excellent | Excellent | Excellent | Excellent | Poor | Fair |
| Antifoaming properties | | Excellent | Good | Excellent | Fair | Fair | Poor | — | — | — | — | — |

3. Evaluation (Reattachment Amount)

To the resist stripper prepared in each of the examples and comparative examples was added 1% solid resist. Using the resulting resist stripper, puddle processing was performed at ordinary temperature for one minute on a wafer prepared by forming Cu and IGZO films on a five-inch Si substrate. The wafer was then rinsed with water and dried, and the number of resist residues on the wafer was measured with a laser scanning surface dust counter (Topcon Corporation) and rated on the following four-point scale.

Excellent: Less than 500
Good: at least 500 but less than 1,500
Fair: at least 1,500 but less than 2,500
Poor: 2,500 or more (Stripping Properties)

A substrate with resist for evaluation was prepared by forming photoresist on a glass substrate with a copper film and etching the photoresist. The substrate was immersed for 120 seconds in the resist stripper adjusted to 50° C., followed by rinsing with water and drying by blowing air. The substrate was observed with an optical microscope (Keyence Corporation) to determine the degree of stripping of photoresist. The results were rated on the following four-point scale.

Excellent: completely stripped
Good: slight photoresist left after stripping
Fair: most photoresist left after stripping
Poor: not stripped at all (Antifoaming Properties)

A volume of 30 ml of the resist stripper prepared in each of the examples and comparative examples was placed in a 100 ml colorimetric tube, which was then mounted on a TS shaker and shaken for two minutes. The shaking was stopped, and one minute later, the foam height (mm) was measured. The results were rated based on the criteria below. Here, a foam height of 5 mm or lower means substantially no foaming and does not hinder the operation of the device; a foam height of more than 5 mm but 15 mm or less means slight foaming but does not substantially hinder the operation of the device. However, a foam height of more than 15 mm means foaming which is highly likely to hinder the operation of the device.

Excellent: 0 mm
Good: more than 0 mm but 5 mm or less
Fair: more than 5 mm but 15 mm or less
Poor: more than 15 mm

The invention claimed is:

1. A resist stripper, comprising:
    (A) an amine;
    (B) an organic solvent; and
    (C) 0.0025 wt % or more and 1.5 wt % or less of a polyanilinesulfonic acid having a weight average molecular weight of 5,000 to 1,000,000 or a salt thereof.

2. The resist stripper according to claim 1, wherein the resist stripper comprises 1 to 40 wt % of an alkanolamine as the component (A).

3. The resist stripper according to claim 1, which is used to strip resist from a substrate with copper and/or IGZO.

4. A method for stripping resist from a substrate with a metallic line and/or a metal oxide film, and inhibiting reattachment of stripped resist to the metallic line and/or the metal oxide film, the method comprising using the resist stripper according to claim 1.

5. The method for stripping resist according to claim 4, wherein the metallic line is formed of copper and the metal oxide film is formed of IGZO.

6. The method according to claim 4, wherein the metallic line is copper and/or the metal oxide film is IGZO.

7. The resist stripper according to claim 1, wherein the resist stripper further comprises (D) water in an amount of 60 wt % or less.

8. The resist stripper according to claim 7, wherein the component (B) and the component (D) are present in a ratio by weight of (B):(D) of 0.2:1 to 70:1.

* * * * *